Figure 7:
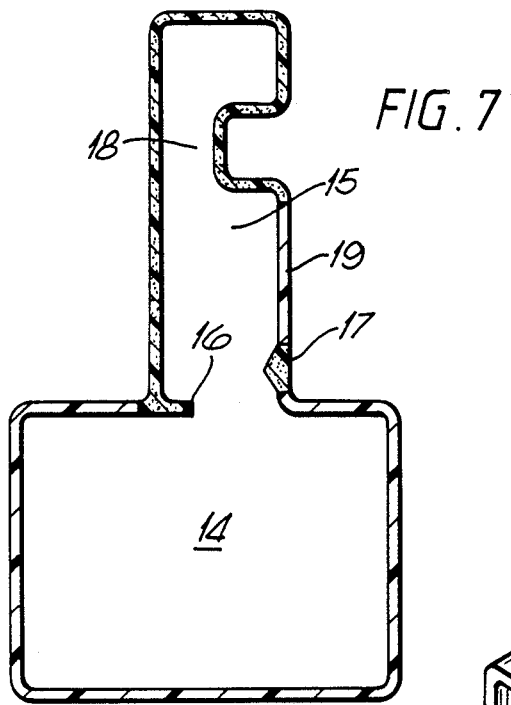

United States Patent [19]

Hsiung

[11] Patent Number: 4,866,574
[45] Date of Patent: Sep. 12, 1989

[54] PACKAGING OF ELECTRICAL COMPONENTS

[76] Inventor: Yen W. Hsiung, 8 Chia Ping Road, Jurong Town, Singapore

[21] Appl. No.: 197,881

[22] Filed: May 24, 1988

[30] Foreign Application Priority Data

May 26, 1987 [GB] United Kingdom ............... 8712338

[51] Int. Cl.⁴ .......................................... B65D 85/42
[52] U.S. Cl. ................................ 361/424; 220/82 R; 206/328; 361/220; 361/392
[58] Field of Search .............. 361/212, 220, 356, 357, 361/380, 392–395, 399, 424, 331; 206/45, 34, 328, 334; 174/35 R, 35 MS, 35 GC; 220/82 R

[56] References Cited

U.S. PATENT DOCUMENTS

| | | | |
|---|---|---|---|
| 4,327,832 | 5/1982 | De Matteo | 174/35 R |
| 4,565,288 | 1/1986 | Walther | 206/328 |
| 4,592,481 | 6/1986 | Chen | 206/328 |
| 4,690,274 | 9/1987 | Lue | 206/328 |
| 4,702,371 | 10/1987 | Hoshi | 361/212 |
| 4,711,350 | 12/1987 | Yen | 361/220 |

FOREIGN PATENT DOCUMENTS 0001123 12/1979 PCT Int'l Appl. ............... 206/334

Primary Examiner—Gerald P. Tolin
Attorney, Agent, or Firm—Fleit, Jacobson, Cohn, Price, Holman & Stern

[57] ABSTRACT

A container for loosely housing single-in-line components comprises an elongate tubular member and includes a hollow central portion for receiving the body of the components, and a portion for receiving the legs of the components. The tubular member is so shaped that the components can only touch the tubular member in certain predetermined locations and to protect the components from static discharges on contacting the container only these locations need be made conductive, the remainder of the container being of transparent plastic.

In one embodiment the container may be provided with conducting ribs on the outside so that when two such containers come into contact it is not possible for two non-conducting parts to come into contact so generating static.

22 Claims, 7 Drawing Sheets

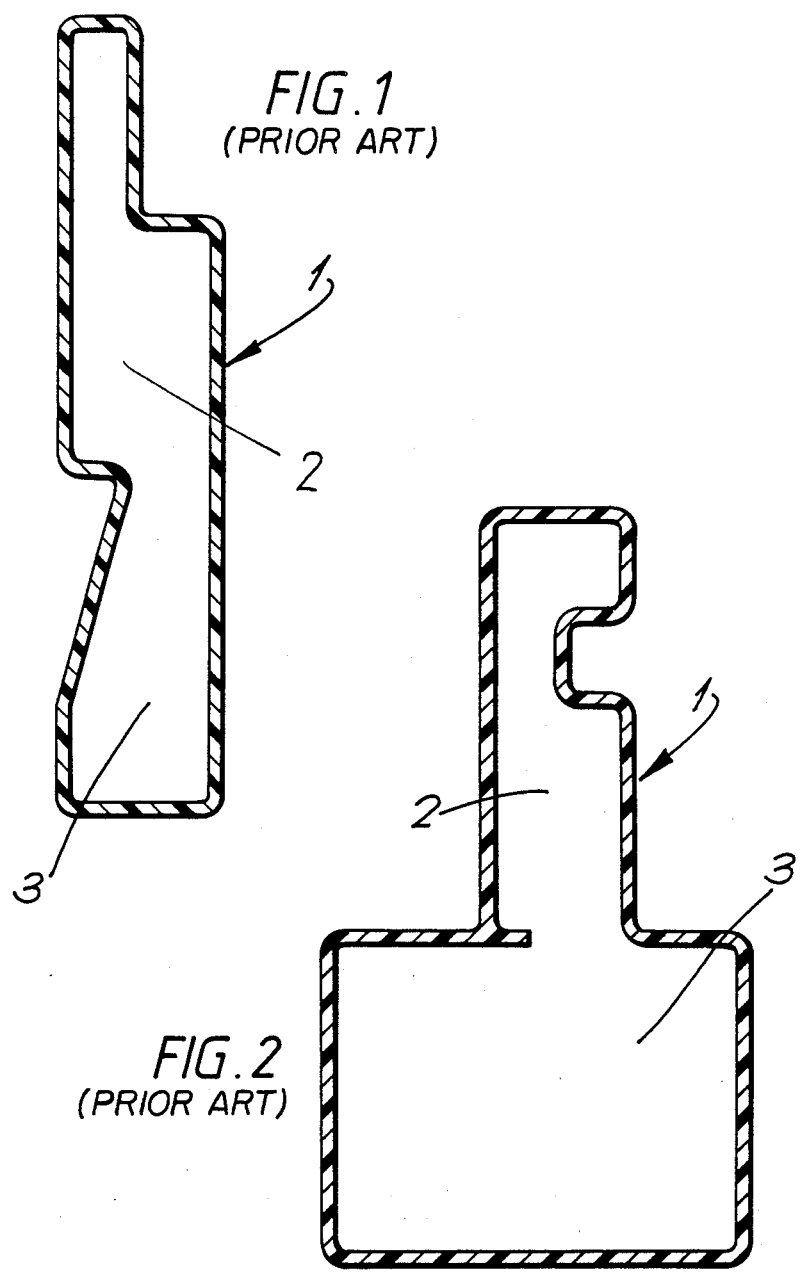

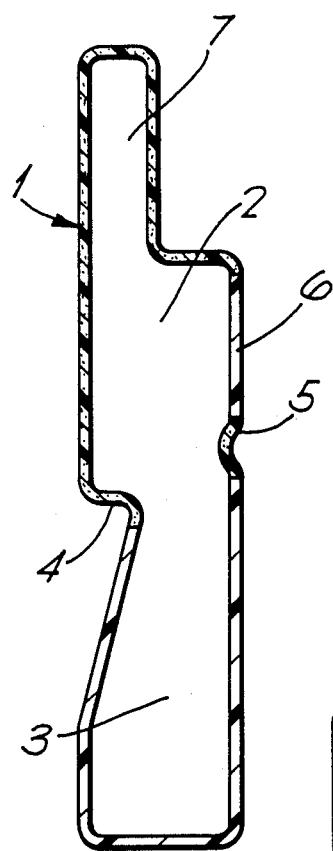
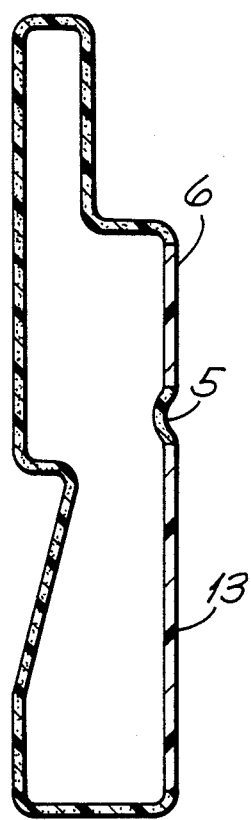
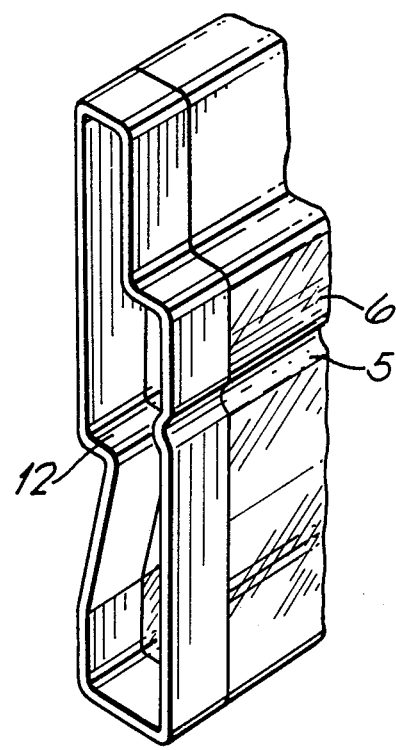

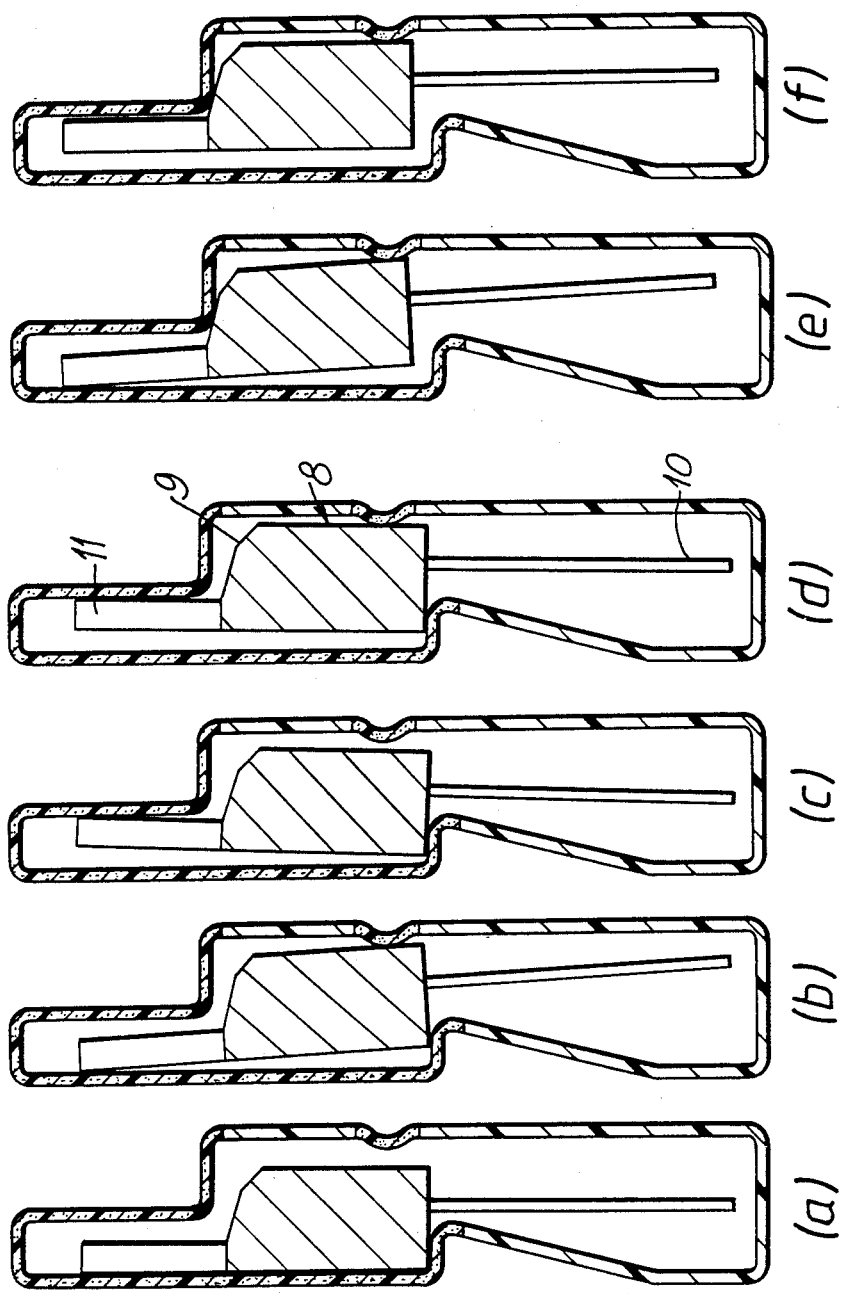

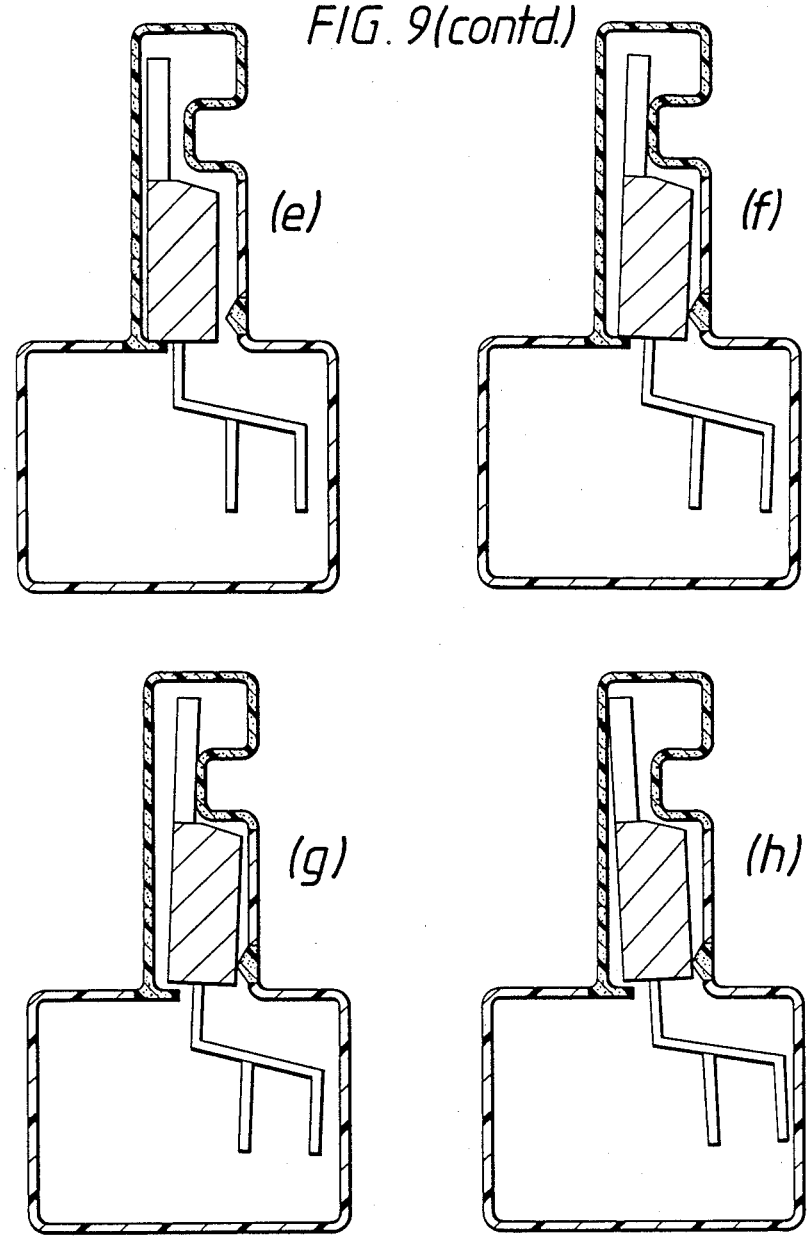

PACKAGING OF ELECTRICAL COMPONENTS

This invention relates to the packaging of electrical components, particularly of the type having terminal pins in a so-called "single-in-line" configuration, that is a row of terminal pins protruding in substantially the same direction from a single side of the component body. Such an electrical component is that hereinafter referred to as being "of the kind described".

Some components of this kind, for example metal-oxide semi-conductor (MOS) integrated circuits, are highly susceptible to static electrical charges and must be packed in anti-static or conducting containers so as to prevent the application of a static charge to one of the terminals of the component which could cause an internal electrical breakdown.

One known type of container for components of the kind described is shown in FIG. 1 which is a cross-sectional view through a container. The container comprises a transparent tube 1 of plastics material having a body receiving portion 2 and a terminal pin receiving portion 3. The tube is provided with a coating of an anti-static agent which is intended to prevent the build up of a static electrical charge on the tube and consequent damage to a component upon contact with the tube. However, the anti-static coating is not always reliable and there remains the possibility that the components may be damaged by a static electrical discharge. A similar container, but adapted for a multi-lead component, is shown in FIG. 2. Again the container comprises an elongated tubular member 1 of transparent plastics material, having a body receiving portion 2 and a terminal pin receiving portion 3.

Another known type of container is the same shape as those shown in FIGS. 1 and 2, but is made of an electrically conductive plastics material. While this tube does prevent static discharges from occuring, the electrically conductive plastics material is opaque and it is therefore not possible to inspect the components held in the container without first emptying the container. Furthermore this container is relatively expensive since it is made fully of conducting material.

It would clearly be desirable to provide a container for components of the type described wherein the danger of damage due to static discharges is minimised, but which allows components held within to be inspected.

According to the present invention there is provided a container for loosely housing at least one electrical component of the kind described, said container comprising an elongate tubular member having a first hollow portion for receiving the said body of the or each said component, and a second hollow portion for receiving the said terminal pins of the or each said component, wherein substantially only those portions of the said tubular member which are contactable by a said component when housed therein are electrically conductive, the tubular member being otherwise substantially transparent, said conductive portions being electrically interconnected.

Clearly such an arrangement, at least in its preferred forms, provides a container which protects the components housed therein from static discharges while allowing the components to be observed. Furthermore the container requires only a small amount of conductive material, thus reducing the cost of the container and also permitting the components to be seen.

Preferably the parts of said tubular member defining the body receiving portion are formed substantially of electrically conductive material, apart from a transparent window whereby said components may be inspected, said window being non-contactable by said components, and wherein said terminal pins are unable to contact the parts of said tubular member defining said terminal pin receiving portion.

Preferably the tubular member is provided with a longitudinally extending inwardly directed conductive rib at the junction of said body receiving and terminal pin receiving portions, said rib serving to define a boundary of said window and to prevent said terminal pins contacting said window and said terminal pin receiving portion.

As stated above, the conductive portions of the container are electrically interconnected, and this results in the conductive portions of the container having uniform conductivity thereby avoiding differences in potential between different conductive portions which might cause short-circuiting of the components.

Preferably the electrical interconnections are provided at one or both ends of the container; however it will be appreciated that there are other possible arrangements. While an electrical connection at each end of the tube is preferred, it is possible to provide only a single connection at any point along the tube. Indeed connections between different adjacent pairs of conductive portions could be provided at different positions.

The container may be formed from suitable plastics material, preferably PVC. The electrically conductive portions thereof may be formed in any suitable manner, but it is preferred to form them by incorporating carbon particles in the material forming the container. The transparent parts of the container may be made anti-static if desired, while still remaining substantially transparent, for example by providing them with a transparent anti-static coating.

Additionally the container may be provided with a plurality of upstanding conducting ribs on the external surface of the tubular member, arranged so that when two such containers are juxtaposed side by side it is not possible for any non-conductive portions of the containers to contact each other. This reduces the amount of static that is generated in a stack of such containers since the contact between two containers is either between two conductive portions or a conductive and a non-conductive portion.

Preferably these ribs are provided on all the outwardly projecting corners of the tubular member adjacent a transparent non-conductive portion.

Figure 8:
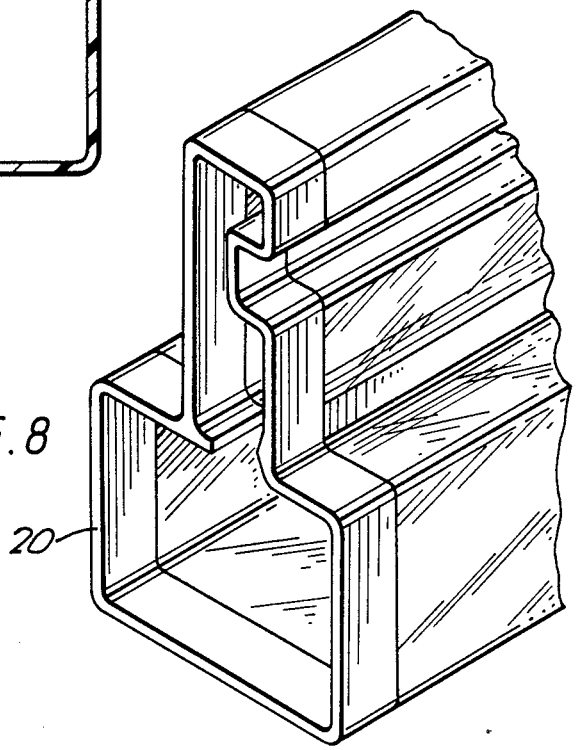
Figure 9:
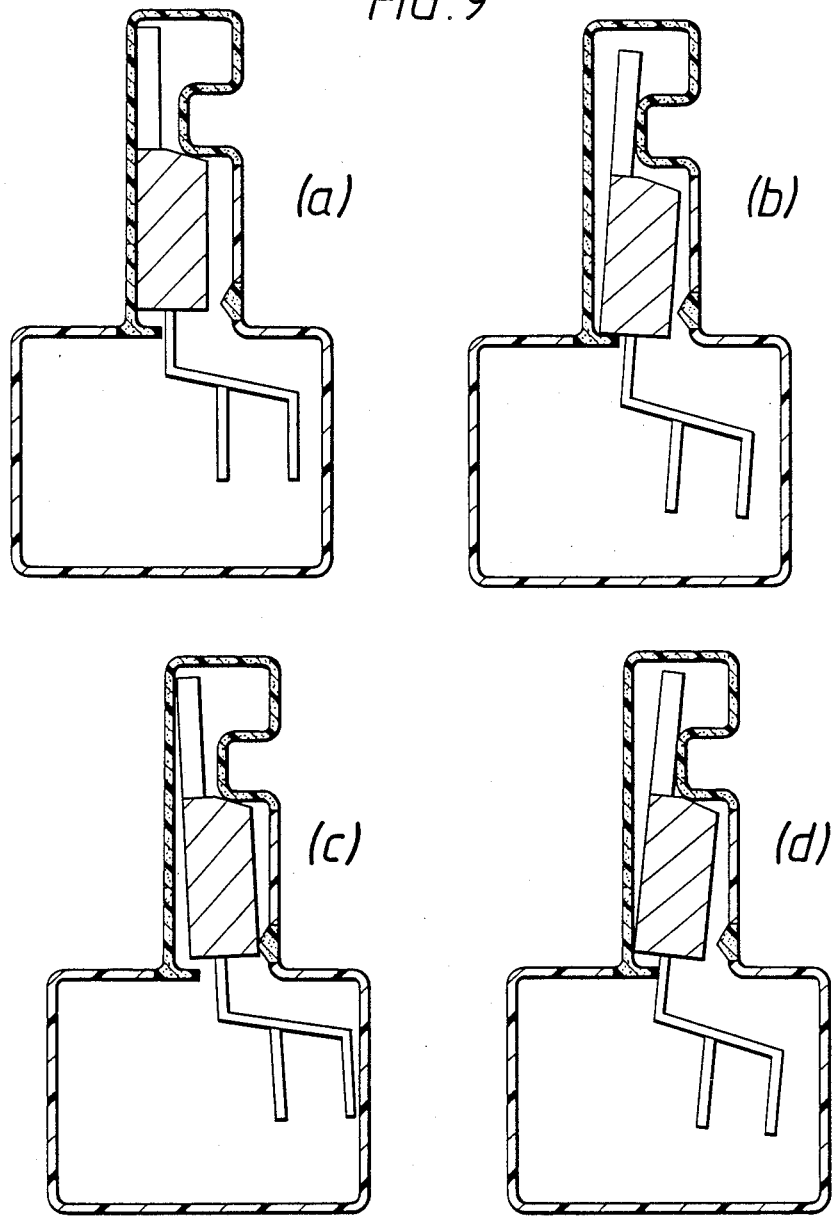
Figure 10:
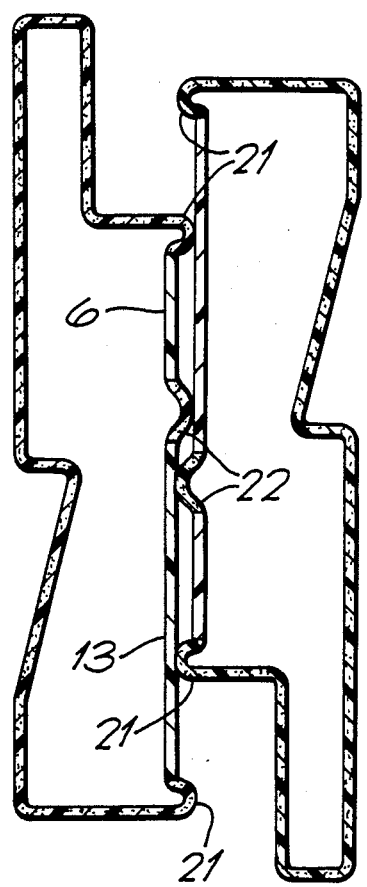

Some embodiments of the invention will now be described by way of example and with reference to the accompanying drawings in which:

FIG. 3 is a cross-sectional view of a container according to a first embodiment of the invention, FIG. 4 is a view similar to FIG. 3 showing a modification of the embodiment of FIG. 3, FIG. 5 is a perspective view of one end of a container of the embodiment of FIG. 3, FIGS. 6 (a)–(f) show a component of the kind described housed within a container of the embodiment of FIG. 3, FIG. 7 is a cross-sectional view of a container according to a second embodiment of the invention, FIG. 8 is a perspective view of one end of a container of the embodiment of FIG. 7, FIG. 8A is a perspective view of an end plug on one end of the embodiment of FIG. 8;

FIGS. 9 (a)-(h) show a component of the kind described housed within a container of the embodiment of FIG. 7, and FIG. 10 shows in a cross-sectional view a further modification of the embodiment of FIG. 3.

Referring first to FIG. 3 there is shown a container in the form of an elongate tubular member 1 made of plastics material. The tubular member is comprised of a portion 2 for receiving the body of a component of the kind described and a portion 3 for receiving the terminal pins of a component. The terminal pin receiving portion 3 is formed of a transparent plastics material, such as for example PVC, while the body receiving portion 2 is formed of an opaque conductive plastics material. At the junction of the body receiving and terminal pin receiving portions there is provided on one side of the container an inwardly directed step 4 and, on the opposite side of the container, an inwardly directed rib 5. Both the step 4 and rib 5 are formed of conductive material and extend the full length of the container. Adjacent to the rib 5, the body receiving portion 2 is provided with a window 6 of transparent plastics material through which components housed in the container may be inspected.

The body receiving portion 2 extends further on the side of the container bearing the step 4 than the side bearing the rib 5 so as to define a space 7 for receiving a mounting tab or a heat sink of the component.

FIGS. 6 (a)-(f) show a component 8 housed within the container of the embodiment shown in FIG. 3, the component being in a different position in each figure. The component has a main body portion 9, a row of terminal pins 10 extending from one side of the component, and a heat sink/mounting tab 11. As can be seen from FIG. 6, because of the cross-sectional shape of the container, the component can only contact the walls of the container in a number of selected regions. In particular it will be noted that the body 9 of the component is unable to contact the window 6 of the body receiving portion, while the terminal pins 10 are unable to contact the walls of the terminal pin receiving portion 3. Consequently to protect the component from static discharges it is only necessary to render conductive those portions of the container that a component may contact. The remaining parts may be left transparent, thus reducing the cost of the container and allowing components housed therein to be inspected.

As will be seen from FIG. 5, the tubular member is provided with an additional ring of electrically conductive material 12 at one or both ends which electrically interconnects the conductive portions. In the absence of such a provision it would be possible for two conductive portions of the container to be at different potentials, and if an electrical component were to contact two such portions simultaneously a potential difference would be applied across the component and it could be damaged.

There may also be provided two end plugs (not shown) made of a suitable plastics material and each having a projecting portion shaped to fit within an end of the tubular member and a rim which abuts the end of the tubular member. It would of course be possible for the aforementioned means electrically interconnecting the said conductive portions to be provided on one or both of the end plugs.

The tubular member is formed from a plastics material such as PVC and is generally transparent except for the electrically conductive portions thereof. The electrically conductive are preferably formed by incorporating a conductive material, e.g. carbon particles, in the plastics material.

FIG. 4 shows a modification of the embodiment of FIG. 3 in which the conductive material extends to the terminal pin receiving portion to provide added protection. Such a modified container may be useful for housing components having longer than usual terminal pins which may therefore contact the base of the terminal pin receiving portion. The modified container shown in FIG. 4 is provided with, in addition to the window 6 in the body receiving portion, a lower window 13 in the terminal pin receiving portion through which the terminal pins may be inspected. It will be appreciated that components housed within the container cannot contact either of these windows by virtue of the shape of the container, and in particular the provision of the inwardly directed conductive rib 5.

FIG. 7 shows a second embodiment of the container which is particularly suited for housing multi-lead tab mounted components of the kind shown in FIG. 9. The main difference between the embodiments of FIGS. 3 and 7 is in the shape of the terminal pin receiving portion. In the embodiment of FIG. 7 the terminal pin receiving portion 14 is much wider than the corresponding portion of the container shown in FIG. 3.

The container shown in FIG. 7 comprises a tubular member having a terminal pin receiving portion 14 and a body receiving portion 15. At the junction of these two portions there is provided on one side of the tubular member an inwardly directed step or ledge 16, and on the opposite side of the tubular member an inwardly directed rib 17. Both the step or ledge 16 and the rib 17 are formed of conductive material and extend the full length of the tubular member. The body receiving portion 15 is provided with a restricted neck section 18 in which, in use, is located the mounting tab of a component and which generally restricts the movement of a component housed within the container.

The body receiving portion 15 is formed of opaque conductive plastics material, except for a transparent window 19 provided adjacent the conductive rib 17. The terminal pin receiving portion 14 is formed of transparent plastics material.

FIGS. 9 (a)-(h) show a component housed within the container shown in FIG. 7 in various different positions. As will be seen from FIG. 9 no matter what position the component takes up, it cannot contact the transparent window 19 or the walls of the tubular member forming the transparent terminal pin receiving portion 14.

As described above with reference to the embodiment of FIG. 3, the conductive portions of the container are electrically interconnected by, for example, a ring 20 (FIG. 8) of conductive material provided at one or both ends of the tubular member. Referring to FIG. 8A as before end plugs 24 may be provided to seal the container.

One of the major causes of static charge being present on such containers is friction occuring between the non-conducting portions of two such containers when they rub against each other. It is therefore desirable to prevent the non-conducting portions of one container from contacting the non-conducting portions of another when they are juxtaposed side by side. FIG. 10 shows a modified form of the container shown in FIG. 4 which meets this requirement. The container is provided with bulbous ribs of conductive material extending longitudinally along the outwardly directed corners 21 of the tubular member adjacent the upper and lower transparent windows 6, 13. An additional bulbous conductive rib 22 is preferably provided adjacent the above described inwardly directed conductive rib.

As can be seen from FIG. 10, which shows two such containers juxtaposed with their non-conductive portions facing each other, the effect of bulbous ribs 21, 22 is to ensure that the non-conductive transparent windows 6, 13 of the two containers cannot contact one another. In a stack of such containers it will be appreciated that the only contact between any two containers will be between either a conductive portion and a conductive portion, or between a conductive portion and a non-conductive portion, but not between two non-conductive portions.

If the container has a different distribution of non-conductive material from that of the container shown in FIGS. 4 and 10, e.g. FIG. 3, then more bulbous conductive ribs may be necessary to achieve the same effect. Preferably a bulbous conductive rib will be provided at each outwardly directed corner adjacent a portion of transparent non-conductive material.

It is to be clearly understood that there are no particular features of the foregoing specification, or of any claims appended hereto, which are at present regarded as being essential to the performance of the present invention, and that any one or more of such features or combinations thereof may therefore be included in, added to, omitted from or deleted from any of such claims if and when amended during the prosecution of this application or in the filing or prosecution of any divisional application based thereon.

I claim:

1. A container for loosely housing an electrical component of the type having a component body and a row of terminal pins protruding in one direction from a single side of the component body, said container comprising an elongate tubular member having a first hollow portion defining a first volume for receiving the body of the component, and a second hollow portion defining a second volume different from said first volume for receiving the terminal pins of the component, said tubular member having spaced electrically conductive portions for contacting said component, the tubular member being transparent except for said conductive portions, said conductive portions being electrically interconnected and dividing said tubular member into a plurality of non-conductive transparent windows.

2. A container according to claim 1 wherein the parts of said tubular member defining the body receiving portion are formed substantially of electrically conductive material, apart from said transparent windows whereby components housed in said container may be inspected, said windows being non-contactable by the components, and wherein terminal pins of the components are unable to contact the parts of said tubular member defining said terminal pin receiving portion.

3. A container according to claim 2 wherein said tubular member is provided with a longitudinally extending inwardly directed conductive rib at the junction of said body receiving and terminal pin receiving portions, said rib serving to define a boundary of said windows and to prevent the terminal pins contacting said windows and said terminal pin receiving portion.

4. A container according to claim 1 wherein said conductive portions are made conductive by carbon particles incorporated in the material of the container.

5. A container according to claim 1 further comprising a pair of end plugs for sealing the ends of said container.

6. A container according to claim 1 wherein said conductive portions are electrically interconnected at at least one end of the container.

7. A container according to claim 1 wherein the said tubular member is provided with upstanding conducting ribs on the external surface thereof, arranged so that when two such containers are juxtaposed side by side the non-conductive portions of the containers cannot contact each other.

8. A container according to claim 7, wherein said conducting ribs extend lengthwise of the container along outwardly projecting corners of said tubular member.

9. A container according to claim 1, further comprised of an electrically conductive anti-static agent coating exterior surfaces of said windows.

10. A container according to claim 1, further comprised of said windows having exterior surfaces, said exterior surfaces being free of anti-static coatings.

11. A package comprising a container which loosely houses one or more electrical components of the type having a component body and a row of terminal pins protruding in one direction from a single side of the component body, said container comprising an elongate tubular member having a first hollow portion for receiving the body of the component, and a second hollow portion for receiving the terminal pins of the component, said tubular member having spaced electrically conductive portions for contacting said component, the tubular member being transparent except for said conductive portions, said conductive portions being electrically interconnected and dividing said tubular member into a plurality of transparent windows.

12. A package according to claim 11, wherein the parts of said tubular member defining the body receiving portion are formed substantially of electrically conductive material, apart from said transparent windows whereby components housed in the package may be inspected, said windows being non-contactable by the components, and wherein terminal pins of the components are unable to contact the parts of said tubular member defining said terminal pin receiving portion.

13. A package according to claim 12, wherein said tubular member is provided with a longitudinally extending inwardly directed conductive rib at the junction of said body receiving and terminal pin receiving portions, said rib serving to define a boundary of said windows and to prevent the terminal pins contacting said windows and said terminal pin receiving portion.

14. A package according to claim 12, wherein said conductive material comprises carbon particles incorporated into the conductive portions of the package.

15. A package according to claim 11, further comprising a pair of end plugs for sealing the ends of said container.

16. A package according to claim 11, wherein said conductive portions are electrically interconnected at at least one end of the package.

17. A package according to claim 11, wherein said tubular member is provided with upstanding conducting ribs on the external surface thereof, arranged whereby when two such containers are juxtaposed sideby-side, non-conductive portions of the containers can not contact each other.

18. A package according to claim 17, wherein said conducting ribs extend lengthwise of the container along outwardly projecting corners of said tubular member.

19. A container according to claim 9, further comprised of an electrically conductive anti-static agent coating exterior surfaces of said windows.

20. A container according to claim 9, further comprised of said windows having exterior surfaces, said exterior surfaces being free of anti-static coatings.

21. A container for loosely housing an electrical component body and a row of terminal pins protruding in one direction from a single side of the component body, said container comprising:

an elongate tubular member having a first hollow volume for receiving the body of the component, and a second hollow volume different from said first volume, for receiving the terminal pins of the component, said tubular member being formed of a non-conductive first material providing a plurality of transparent windows and an electrically conductive second material separating said plurality of windows.

22. A container according to claim 21, further comprised of said windows being so disposed within said elongate tubular member as to be non-contactable by components housed within said container.

* * * * *